(12) United States Patent
Jang et al.

(10) Patent No.: US 9,082,671 B2
(45) Date of Patent: Jul. 14, 2015

(54) ARRAY SUBSTRATE FOR LIQUID CRYSTAL DISPLAY DEVICE AND METHOD OF MANUFACTURING THE SAME

(75) Inventors: Doo-Hee Jang, Paju-si (KR); Young-Sup Jung, Seoul (KR); Jeong-Yun Lee, Seoul (KR); Ju-Ran Lee, Anseong-si (KR); Soo-Young Choi, Seongnam-si (KR)

(73) Assignee: LG DISPLAY CO., LTD., Seoul (KR)

( * ) Notice: Subject to any disclaimer, the term of this patent is extended or adjusted under 35 U.S.C. 154(b) by 95 days.

(21) Appl. No.: 13/587,625

(22) Filed: Aug. 16, 2012

(65) Prior Publication Data

US 2013/0043477 A1 Feb. 21, 2013

(30) Foreign Application Priority Data

Aug. 19, 2011 (KR) ........................ 10-2011-0082931

(51) Int. Cl.
*G01R 31/26* (2014.01)
*H01L 27/12* (2006.01)
*G02F 1/1343* (2006.01)
*G02F 1/1335* (2006.01)

(52) U.S. Cl.
CPC ........ *H01L 27/1259* (2013.01); *G02F 1/13439* (2013.01); *G02F 1/134363* (2013.01); *G02F 1/133553* (2013.01); *G02F 2201/40* (2013.01)

(58) Field of Classification Search
CPC .......... G02F 1/134363; G02F 1/13439; G02F 2201/40; G02F 1/133555; G02F 1/13458; G02F 2001/13629; G02F 2001/136295; G02F 2201/124; G02F 1/1303; G02F 1/133504; G02F 1/133512; G02F 1/133514
See application file for complete search history.

(56) References Cited

U.S. PATENT DOCUMENTS

| | | | |
|---|---|---|---|
| 2006/0220018 A1* | 10/2006 | Ahn et al. | 257/59 |
| 2007/0096098 A1* | 5/2007 | Ishiga et al. | 257/59 |
| 2008/0049176 A1* | 2/2008 | Kim et al. | 349/114 |
| 2008/0311361 A1* | 12/2008 | Lee et al. | 428/209 |
| 2009/0286360 A1* | 11/2009 | Jo et al. | 438/149 |
| 2010/0210053 A1* | 8/2010 | Kim | 438/30 |

* cited by examiner

*Primary Examiner* — Robert Bachner
(74) *Attorney, Agent, or Firm* — Brinks Gilson & Lione (57) ABSTRACT

An array substrate for a liquid crystal display device comprises: gate and data lines crossing each other on a substrate to define a pixel region; a common line spaced apart from and parallel with the gate line; a thin film transistor in the pixel region and connected to the gate and data lines; a passivation layer on the thin film transistor; and pixel and common electrodes alternately arranged to produce an in-plane electric field, wherein each of the pixel and common electrodes has a double-layered structure of which the lower layer is formed of reflective conductive material and the upper layer is formed of transparent conductive material.

14 Claims, 12 Drawing Sheets

FIG. 9

ARRAY SUBSTRATE FOR LIQUID CRYSTAL DISPLAY DEVICE AND METHOD OF MANUFACTURING THE SAME

This application claims the priority and the benefit under 35 U.S.C. §119(a) on Korean Patent Application No. 10-2011-0082931, filed on Aug. 19, 2011, the entire contents of which are hereby incorporated by reference.

BACKGROUND

1. Field of the Invention

The present disclosure relates to an array substrate for a liquid crystal display device, and more particularly, to an array substrate for an in-plane switching mode liquid crystal display device and a method of manufacturing the same.

2. Discussion of the Related Art

Until recently, display devices have typically used cathode-ray tubes (CRTs). Presently, however, many efforts and studies are being made to develop various types of flat panel displays, such as liquid crystal display (LCD) devices, plasma display panels (PDPs), field emission displays, and electroluminescence displays (ELDs), as substitutes for the CRTs. Of these flat panel displays, LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

The LCD device using an electric field induced in a vertical direction has disadvantage in viewing angles. To solve this problem, an in-plane switching (IPS) mode LCD device using an in-plane electric field is proposed.

Figure 1:
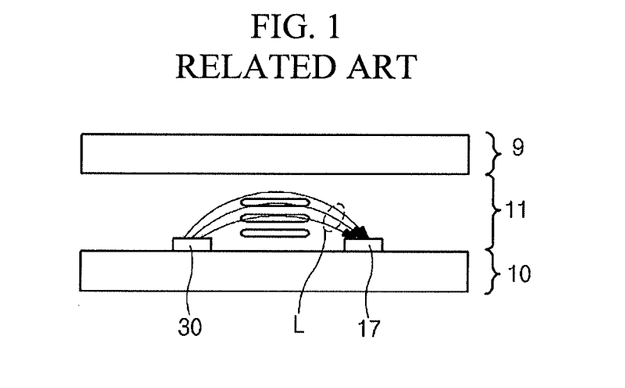
FIG. 1 is a schematic cross-sectional view illustrating an IPS mode LCD device according to a related art.

FIG. 1 is a schematic cross-sectional view illustrating an IPS mode LCD device according to a related art.

Referring to FIG. 1, the IPS mode LCD device includes an array substrate 10, a color filter substrate 9 and a liquid crystal layer 11. The array substrate 10 includes pixel and common electrodes 30 and 17 alternately arranged to produce an in-plane electric field L. The liquid crystal layer 11 is operated by the electric field L.

Figure 2A:
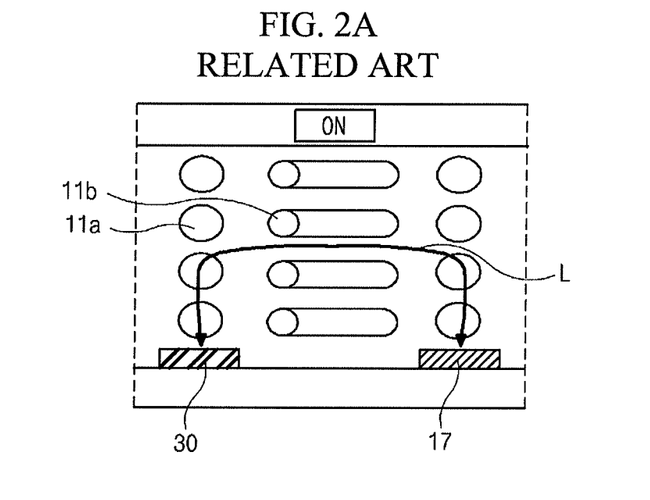
FIGS. 2A and 2B are schematic views illustrating operations in ON and OFF states, respectively, of the IPS mode LCD device according to the related art.
Figure 2B:
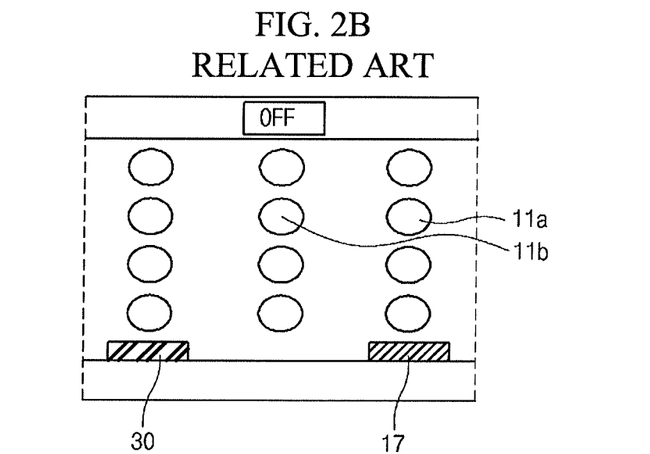

FIGS. 2A and 2B are schematic views illustrating operations in ON and OFF states, respectively, of the IPS mode LCD device according to the related art.

Referring to FIG. 2A, in the ON state, alignment of liquid crystal molecules 11a right over the pixel and common electrodes 30 and 17 is not changed while alignment of liquid crystal molecules 11b over a region between the pixel and common electrodes 30 and 17 is changed and aligned along the electric field L. In other words, since the liquid crystal molecules 11a and 11b are operated by the in-plane electric field L, viewing angles is widened. Accordingly, the IPS mode LCD device has wide viewing angles of about 80 degrees to about 89 degrees in up/down/right/left directions. Herein and hereafter, "/" refers to "and".

Referring to FIG. 2B, in the OFF state, an in-plane electric field is not induced between the pixel and common electrodes 30 and 17, and arrangement of the liquid crystal molecules 11a and 11b is not changed.

Figure 3:
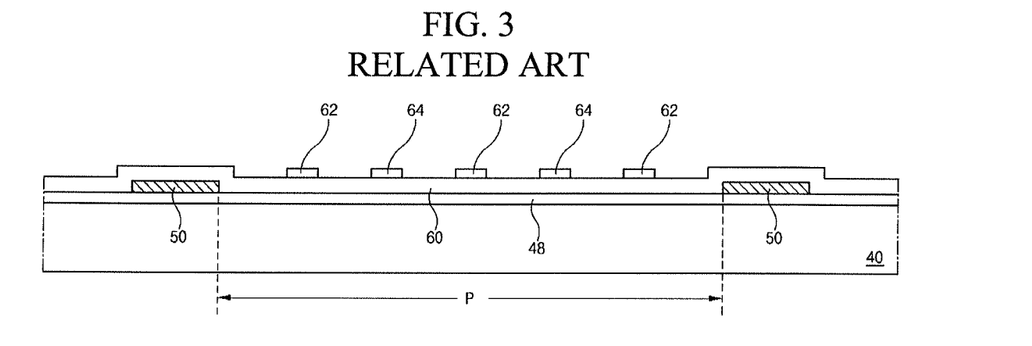
FIG. 3 is a cross-sectional view illustrating a pixel region of the IPS mode LCD device according to the related art.

FIG. 3 is a cross-sectional view illustrating a pixel region of the IPS mode LCD device according to the related art.

Referring to FIG. 3, a gate insulating layer 48 is formed on a substrate 40, a data line 50 is formed on the gate insulating layer 48, a passivation layer 60 is formed on the data line 50, and pixel and common electrodes 64 and 62 are formed on the passivation layer 60. The pixel and common electrodes 64 and 62 alternate in a pixel region P.

Although not shown in the drawings, a gate line and a common line are formed below the gate insulating layer 48, and a thin film transistor is formed near the crossing portion of the gate line and the data line 50. The gate line and the data line 50 define the pixel region P. The thin film transistor includes a gate electrode, a semiconductor layer, and source and drain electrodes.

The pixel electrode 64 is connected to the drain electrode, and the common electrode 62 is connected to the common line. The pixel and common electrodes 64 and 62 have a bar shape.

The pixel and common electrodes 64 and 62 are formed with a single-layered structure using a transparent conductive material or an opaque metal. In this structure, an ambient contrast ratio is decreased because of the high light reflectance for ambient light.

Furthermore, the pixel and common electrodes 64 and 62 each have a width of about 2.2 μm or more. Such the width is caused by resolution limit of a light exposure apparatus which is used in a patterning process.

In more detail, in order to form and pattern a metal layer or semiconductor layer on a substrate, a photoresist layer is formed on the metal layer or semiconductor layer, then light exposure is performed using a light exposure apparatus, then the photoresist layer is developed to form a photoresist pattern having a predetermined width, and then the metal layer or semiconductor layer is etched using the photoresist pattern as an etching mask, thereby forming a metal pattern or semiconductor pattern.

At the current level of the art, a photoresist pattern having a width of about 3.1 μm or less cannot be stably realized because of resolution limit of the light exposure apparatus. Accordingly, the photoresist pattern should have a width of at least 3.1 μm.

When a metal layer or semiconductor layer is etched using the photoresist patter of at least 3.1 μm, even though an over-etching is conducted, limit of a side etch bias is 0.9 μm and a metal pattern or semiconductor pattern having a width of about 2.2 μm or less cannot be formed thus. The etch bias means an amount of width of a layer that is inward removed with respect to side edges of the photoresist layer.

Because of the patterning restriction, the pixel and common electrodes of the related art have a width of about 2.2 μm or more.

Aperture ratio of a pixel region is defined as a ratio of a total region of the pixel region to a region except for a region of the pixel region that is blocked by elements in the pixel region. However, in the related art, width of the pixel and common electrodes cannot be further reduced. Accordingly, this is problematic in improvement of brightness and low power consumption.

BRIEF SUMMARY

An array substrate for a liquid crystal display device includes gate and data lines crossing each other on a substrate to define a pixel region; a common line spaced apart from and parallel with the gate line; a thin film transistor in the pixel region and connected to the gate and data lines; a passivation layer on the thin film transistor; and pixel and common electrodes alternately arranged to produce an in-plane electric field, wherein each of the pixel and common electrodes has a double-layered structure of which the lower layer is formed of a reflective conductive material and the upper layer is formed of a transparent conductive material.

In another aspect, a method of manufacturing an array substrate for a liquid crystal display device, comprises: forming a reflective conductive material layer having a first thickness on a substrate; forming a transparent conductive material layer having a second thickness on the reflective conductive layer material under a condition of $H_2O$ gas; forming a photoresist pattern on the transparent conductive material layer; and etching the transparent conductive material layer and the reflective conductive material layer using the photoresist pattern as an etching mask, thereby forming double-layered pixel and common electrodes.

It is to be understood that both the foregoing general description and the following detailed description and appended drawings are by way of example and explanatory, and are intended to provide a further explanation of the invention as claimed. The invention may admit to other equally effective embodiments.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

Reference will now be made in detail to the example embodiments of the invention, which are illustrated in the accompanying drawings.

Figure 4:
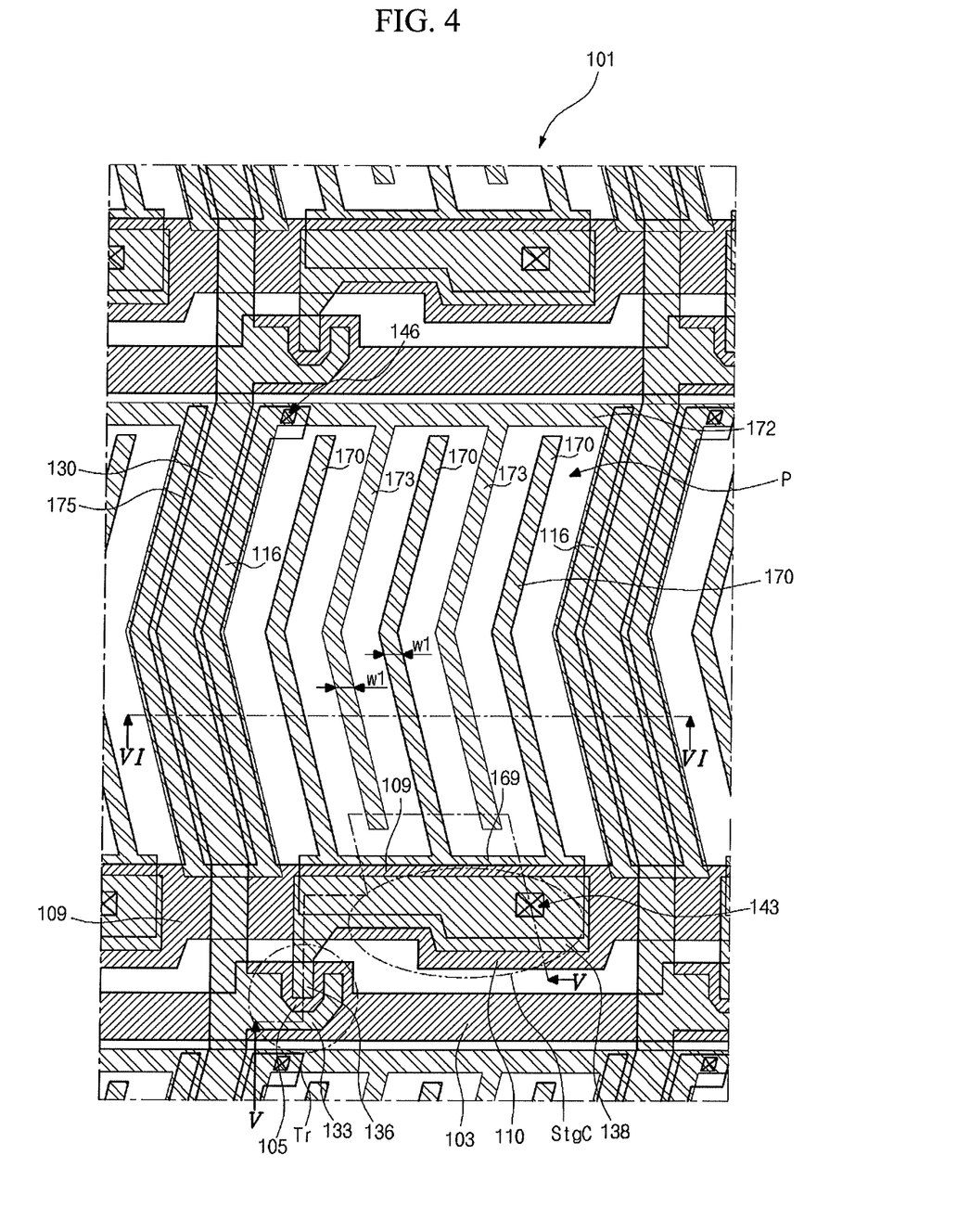
FIG. 4 is a plan view illustrating an IPS mode LCD device according to a first embodiment of the invention.

FIG. 4 is a plan view illustrating an IPS mode LCD device according to a first embodiment of the invention.

Referring to FIG. 4, the LCD device includes an array substrate 101, an opposing substrate, and a liquid crystal layer between the array substrate 101 and the opposing substrate.

The array substrate 101 includes a gate line 103 and a data line 130 crossing each other with a gate insulating layer therebetween to thereby define a pixel region P. A common line 109 is spaced apart from the gate line 103 and may be made of the same material as the gate line 103.

A thin film transistor Tr is formed near the crossing portion of the gate and data lines 103 and 130.

The thin film transistor Tr includes a gate electrode 105, the gate insulating layer, a semiconductor layer, and source and drain electrodes 133 and 136.

An outermost common electrode 116 is formed at each of both sides of the pixel region P. The outermost common electrode 116 extends from the common line 109 and is parallel with the data line 130.

A first auxiliary pattern 172 is formed in the pixel region P. The first auxiliary pattern 172 contacts the outermost common electrode 116 through a common contact hole 146. A plurality of middle common electrodes 173 extend from the first auxiliary pattern 172. The middle common electrode 173 may have a same or similar bar shape as the outermost common electrode 116. The middle common electrodes 173 are between the two outmost common electrodes 116 located at the both sides of the pixel region P.

As shown in FIG. 4, the first auxiliary pattern 172 may be formed at a peripheral region of the pixel region P overlapping the data line 130 and the outermost common electrode 116 so that it can function as a black matrix to prevent light leakage. Alternatively, the first auxiliary pattern 172 may be configured such that portions of the first auxiliary pattern 172 corresponding to the data line 130 and the outermost common electrode 116 are omitted and the first auxiliary pattern 172 has only a portion in the pixel region P.

A second auxiliary pattern 169 may contact the drain electrode 136 through a drain contact hole 143 and overlap the common line 109. A plurality of pixel electrodes 170 extend from the second auxiliary pattern 169 and are located between the outermost common electrodes 116 located at the both sides of the pixel region P, and alternate with the middle common electrodes 173. The pixel electrode 170 has the same shape as the middle common electrode 173.

The pixel electrode 170 and the outermost and middle common electrodes 116 and 173 may have a bent shape with respect to a center of the pixel region P. For example, the pixel electrode 170 and the outermost and middle common electrodes 116 and 173 are bent or are inclined with respect to a virtual line parallel with the gate line 103. This configuration forms two different domains in the pixel region P divided by the bent points. This configuration prevents or reduces color difference according to variation of viewing angles and thereby improves display quality.

The data line 130 has the same bent portion as the pixel electrode 170 and the outermost and middle common electrodes 116 and 173. Accordingly, the data line 130 has a zigzag shape overall.

Alternatively, the pixel electrode 170, the outermost and middle common electrodes 116 and 173, and the data line 130 may have a shape other than the bent shape, for example, a straight shape.

In the pixel region P, the common line 109 and the drain electrode 136 overlapping each other with the gate insulating layer therebetween form a storage capacitor StgC. A portion of the common line 109 and a portion of the drain electrode 136 overlapping each other are referred to as first and second storage electrodes 110 and 138, respectively.

Each of the pixel and middle common electrodes 170 and 173 may be configured to have a double-layered structure using two heterogeneous conductive materials and have a width of about 0.5 μm to 2.2 μm.

In this instance, a lower layer of the double-layered structure may be made of at least one of molybdenum (Mo), molybdenum-titanium (MoTi), copper (Cu) and copper nitride (CuNx), and an upper layer of the double-layered structure may be made of at least one of indium-tin-oxide (ITO), indium-zinc-oxide (IZO) and aluminum-doped zinc oxide (AZO).

Accordingly, since the pixel and common electrodes have the width of 0.5 μm to 2.2 μm, the LCD device of the embodiment has aperture ratio greater than the related art. Further, because of the double-layered structure, light reflectance for anbient light may be 35% or less, and ambient contrast ratio can thus be improved.

Figure 5:
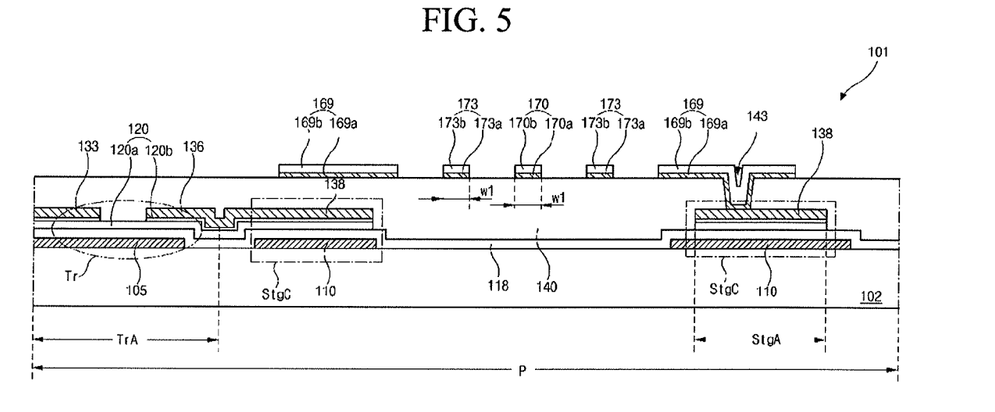
FIGS. 5 and 6 are cross-sectional views taken along lines V-V and VI-VI of FIG. 4, respectively.
Figure 6:
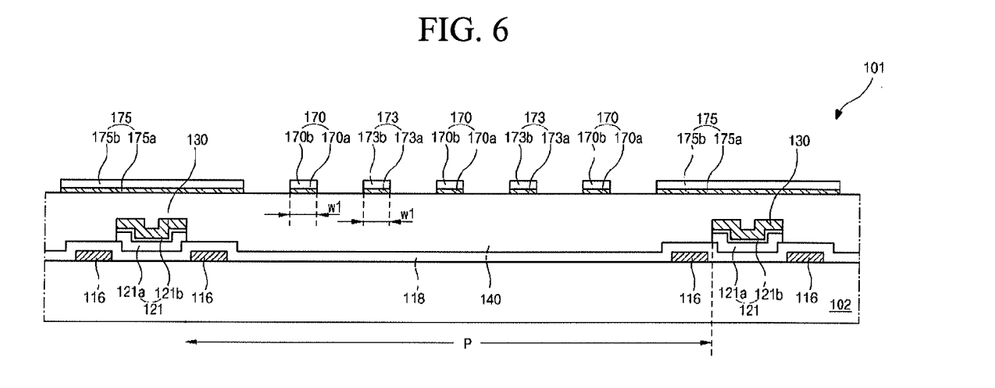

FIGS. 5 and 6 are cross-sectional views taken along lines V-V and VI-VI of FIG. 4, respectively. For the purpose of explanations, a region where a thin film transistor Tr is formed is defined as a switching region TrA, and a region where a storage capacitor StgC is formed is defined as a storage region StgA.

Referring to FIGS. 4 to 6, a gate line (103 of FIG. 4) is formed on a transparent substrate 102, and a common line (109 of FIG. 4) is spaced apart from and parallel with the gate line 103. A portion of the gate line 103 corresponding to the switching region TrA may function as a gate electrode 105.

In a pixel region P, an outermost common electrode 116 extending from the common line 109 is formed near a data line 130. In the storage region StgA, a portion of the common line 109 may function as a first storage electrode 110.

A gate insulating layer 118 is formed on the gate line 103, the gate electrode 105, the common line 109 and the first common electrode 116. The gate insulating layer 118 may be made of silicon oxide ($SiO_2$) or silicon nitride (SiNx).

A semiconductor layer 120 is formed on the gate insulating layer 118 in the switching region TrA. The semiconductor layer 120 includes an active layer 120a of intrinsic amorphous silicon and an ohmic contact layer 120b of extrinsic amorphous silicon on the active layer 120a.

The data line 130 crossing the gate line 103 to define the pixel region P is formed on the gate insulating layer 118. A semiconductor pattern 121 may be formed below the data line 130 and include first and second patterns 121a and 121b which are formed of the same materials as the active layer 120a and the ohmic contact layer 120b, respectively. Alternatively, the semiconductor pattern 121 may be omitted.

In the switching region TrA, a source electrode 133 extending from the data line 130 and a drain electrode 136 spaced apart from the source electrode 133 are formed on the semiconductor layer 120. The source and drain electrodes 133 and 136 contact the ohmic contact layer 120b therebelow.

The gate electrode 105, a portion of the gate insulating layer 118, a portion of the semiconductor layer 120, and the source and drain electrodes 133 and 136 form the thin film transistor Tr.

In the storage region StgA, the drain electrode 136 extends over the first storage electrode 110 to form a second storage electrode 138. The first and second storage electrodes 110 and 138 and the gate insulating layer therebetween form the storage capacitor StgC.

A passivation layer 140 is formed on the data line 130, the source and drain electrodes 133 and 136 and the second storage electrode 138. The passivation layer 140 may be made of an organic insulating material having a relatively low dielectric constant, for example, photo acrylic. The passivation layer 140 is for minimizing a parasitic capacitance produced by overlap between the data line 130 and the outermost common electrode 116, and a shield pattern 175 thereon, and minimizing an effect of an unwanted electric field between the data line 130 and the outermost common electrode 116.

The passivation layer 140 includes a common contact hole (146 of FIG. 4) exposing an end of the outermost common electrode 116, and a drain contact hole 143 exposing the drain electrode 136, and more accurately, the second storage electrode 138.

A first auxiliary pattern (172 of FIG. 4) and a second auxiliary pattern 169 are formed on the passivation layer 140 in the pixel region P. The first auxiliary pattern 172 and the second auxiliary pattern 169 are located at the opposite sides of the pixel region P and face each other.

Each of the first auxiliary pattern 172 and the second auxiliary pattern 169 has a double-layered structure, which includes a lower layer made of a reflective conductive material, for example, at least one of molybdenum (Mo), molybdenum-titanium (MoTi), copper (Cu) and copper nitride (CuNx), and an upper layer made of a transparent conductive material, for example, at least one of indium-tin-oxide (ITO), indium-zinc-oxide (IZO) and aluminum-doped zinc-oxide (AZO).

The first auxiliary pattern 172 contacts the outermost common electrode 116 through the common contact hole 146, and the second auxiliary electrode 169 contacts the second storage electrode 138 through the drain contact hole 143.

The shield pattern 175 extending from the first auxiliary pattern 172 is formed on the passivation layer 140 overlapping the data line 130 and the outermost common electrode 116. Accordingly, the shield pattern 175 functions as a black matrix. Alternatively, the shield pattern 175 may be omitted.

A plurality of middle common electrodes 173 extending from the first auxiliary pattern 172 are formed on the passivation layer 140 in the pixel region P and has the double-layered structure. The middle common electrodes 173 are located between the outermost common electrodes 116 at both sides of the pixel region P. The middle common electrode 173 extends over the pixel region P and has a bar shape like the outermost common electrode 116.

A plurality of pixel electrodes 170 extending from the second auxiliary pattern 169 are formed on the passivation layer 140 in the pixel region P has the double-layered structure. The pixel electrodes 170 are configured to alternate with the middle common electrodes 173 and be located between the outermost common electrodes 116 at the both sides of the pixel region P. The pixel electrode 170 extends over the pixel region P and has a bar shape like the outermost and middle common electrodes 116 and 173.

It is preferred, but not required, that the pixel electrode 170 and the middle common electrode 173 have a width w1 of about 0.5 μm to about 2.2 μm.

Further, it is preferred, but not required, that the lower layers 170a and 173a of the pixel electrode 170 and the middle common electrode 173 each have a thickness of about 50 Å to about 500 Å, and the upper layers 170b and 173b of the pixel electrode 170 and the middle common electrode 173 each have a thickness of about 200 Å to about 600 Å. In this case, it is preferred, but not required, that the upper layers 170b and 173b are greater than the lower layers 170a and 173a.

As described above, the pixel electrode 170 and the middle common electrode 173 have the width w1 less than that of the related art. Accordingly, aperture ratio can increase.

Further, when an LCD device has pixel and common electrodes of a single-layered structure using molybdenum-titanium (MoTi), this LCD device has light reflectance of about 68%. However, the LCD device having the above-described double-layered structure has light reflectance of about 39% or less. Accordingly, light reflectance can be remarkably reduced.

The reduction of light reflectance can be achieved by anti-reflection coating effect. In other words, when the double-layered structure is configured using two different materials coated with different thicknesses and different refractive indices, the differences makes anti-reflection coating effect that lights reflecting from the double layers undergo destructive interference, and intensity of light reflecting from the LCD device can be thus reduced.

Further, a process to pattern the pixel and common electrodes is performed using a galvanic phenomenon which is a heavy corrosion phenomenon occurring in the more active metal because of a potential difference produced between two different metals when the different metals are exposed to a corrosion solution. Accordingly, compared to a case of patterning a single-layered metal layer, a side etch bias width increases. Therefore, the pixel electrode 170 and the common electrode 173 having a width of 0.5 μm to 2.2 μm can be produced.

FIGS. 7A to 7G and 8A to 8G are cross-sectional views, taken along lines V-V and VI-VI, respectively, illustrating a method of manufacturing the LCD device according to the embodiment of the present invention.

Figure 7A:
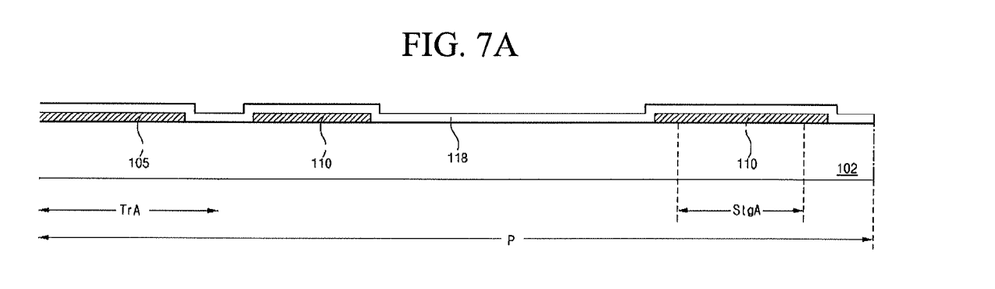
FIGS. 7A to 7I and 8A to 8I are cross-sectional views, taken along lines V-V and VI-VI of FIG. 4, respectively, illustrating a method of manufacturing the LCD device according to the embodiment of the present invention.
Figure 8A:
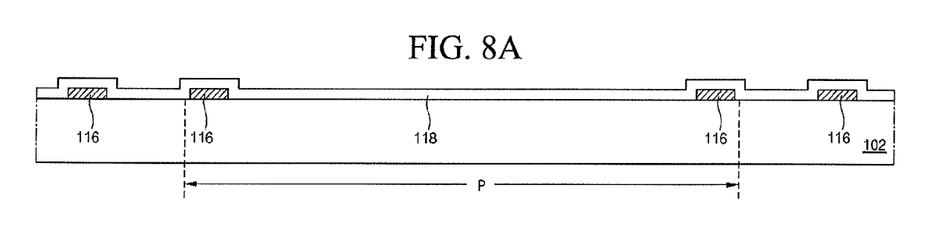

Referring to FIGS. 7A and 8A, a first metal material, for example, at least one of aluminum (Al), aluminum alloy (e.g., AlNd), copper (Cu), copper alloy and chromium (Cr) is deposited on a substrate 102 to form a first metal layer.

Then, the first metal layer is patterned to form a gate line (103 of FIG. 4), a common line (109 of FIG. 4), a first storage electrode 110, a gate electrode 105 connected to the gate line, and an outermost common electrode 116 connected to the common line.

Then, a gate insulating layer 118 is formed on the substrate 102 having the gate line and the common line. The gate insulating layer 118 may be made of silicon oxide ($SiO_2$) or silicon nitride (SiNx).

Figure 7B:
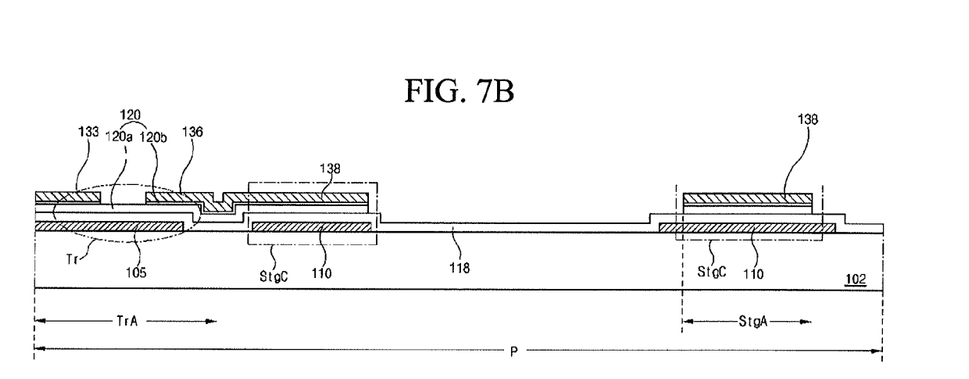
Figure 8B:
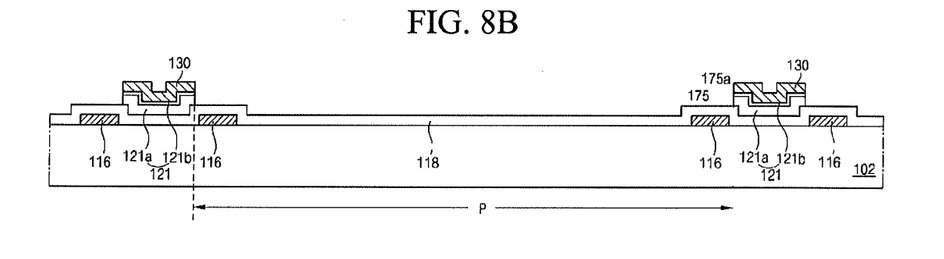

Then, referring to FIGS. 7B and 8B, an intrinsic amorphous silicon layer, an impurity-doped amorphous silicon layer and a second metal layer are sequentially formed on the gate insulating layer 118. Then, the intrinsic amorphous silicon layer, the impurity-doped amorphous silicon layer and the second metal layer may be patterned simultaneously using one mask process with a diffraction mask or halftone mask, or the second metal layer, and the intrinsic amorphous silicon layer and the impurity-doped amorphous silicon layer may be patterned using 2 mask processes, respectively.

Through the patterning process, a semiconductor layer 120 and source and drain electrodes 133 and 136 are formed. The semiconductor layer 120 includes an active layer 120a of intrinsic amorphous silicon, and an ohmic contact layer 120b of impurity-doped amorphous silicon. The source and drain electrodes 133 and 136 are spaced apart from each other.

The gate electrode 105, a portion of the gate insulating layer 118, a portion of the semiconductor layer 120 and the source and drain electrodes 133 and 136 form a thin film transistor Tr in a switching region TrA.

Further, a data line 130 crossing the gate line to define a pixel region P is formed on the gate insulating layer 118.

The drain electrode 136 extends over a portion of the common line 109 i.e., a first storage electrode 110. A portion of the drain electrode 136 over the first storage electrode 110 is a second storage electrode 138. The first and second storage electrodes 110 and 138 and the gate insulating layer 118 therebetween form a storage capacitor StgC in a storage region StgA.

For the purpose of explanations, it is shown in this embodiment that one mask process using a diffraction mask or halftone mask is performed for the second metal layer, the impurity-doped amorphous silicon layer and the intrinsic amorphous silicon layer. In this instance, a semiconductor pattern 121 is formed below the data line 130, and the semiconductor pattern 121 includes first and second patterns 121a and 121b made of the same material as the active layer 120a and the ohmic contact layer 120b, respectively.

Alternatively, in another instance where the semiconductor pattern 121 below the data line 130 may be omitted, a first mask process is performed to pattern the impurity-doped amorphous silicon and the intrinsic amorphous silicon in order to only form the semiconductor layer 120, then the second metal layer is formed on the substrate 102 having the semiconductor layer, and then a second mask process is performed to pattern the second metal layer.

Figure 7C:
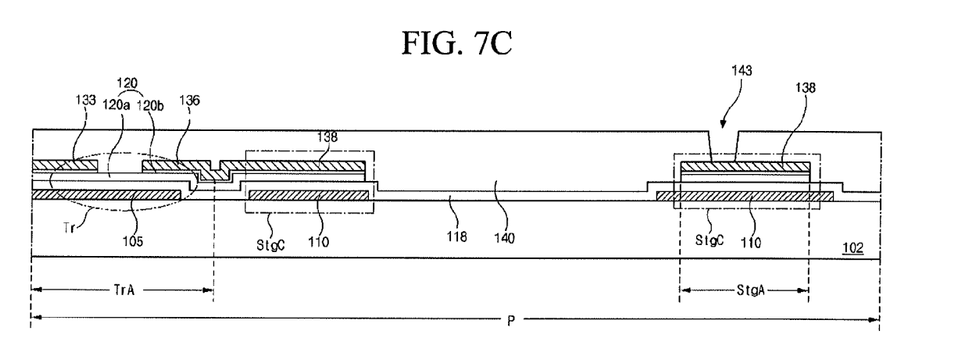
Figure 8C:
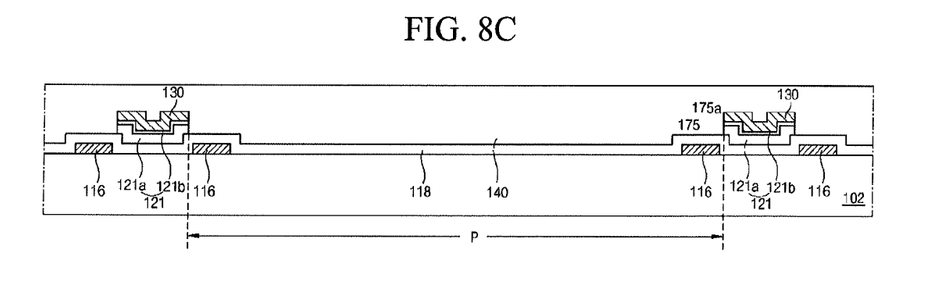

Then, referring to FIGS. 7C and 8C, a passivation layer 140 is formed on the substrate 102 having the data line 130, and the source and drain electrodes 133 and 136. The passivation layer 140 may be made of an organic insulating material, for example, photo acrylic.

Then, a mask process is performed for the passivation layer 140 to form a drain contact hole 143 exposing the second storage electrode 138 and a common contact hole (146 of FIG. 4) exposing the outermost common electrode 116.

Figure 7D:
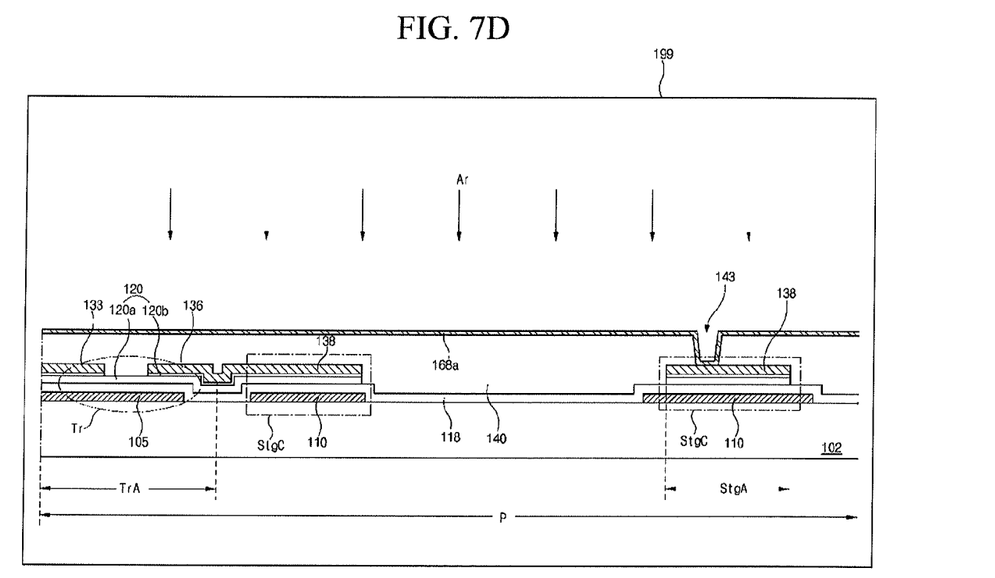
Figure 8D:
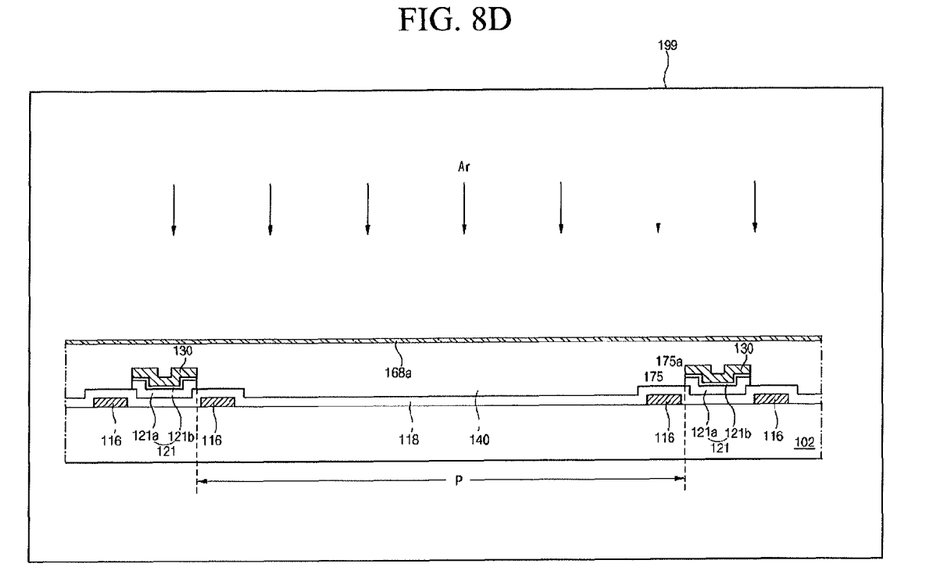

Then, referring to FIGS. 7D and 8D, the substrate 102 having the passivation layer 140 is placed in a chamber 199 of a sputtering apparatus, and then a sputtering is performed using a plasma under argon (Ar) atmosphere. Accordingly, a reflective conductive material layer 168a is formed on the passivation layer 140. For example, the reflective conductive material layer 168a may be made of molybdenum (Mo), molybdenum-titanium (MoTi), copper (Cu) or copper nitride (CuNx). The reflective conductive material layer 168a may have a first thickness of about 50 Å to 500 Å.

Figure 7E:
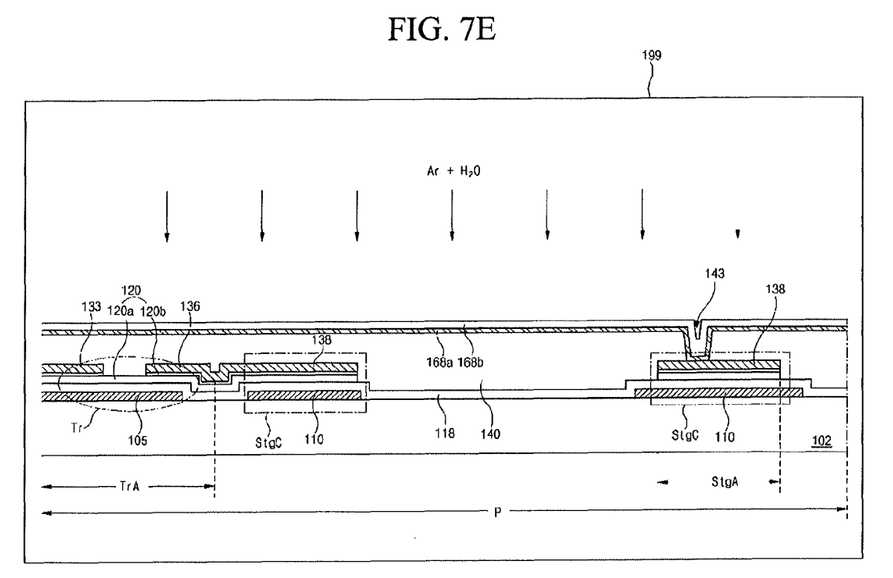
Figure 8E:
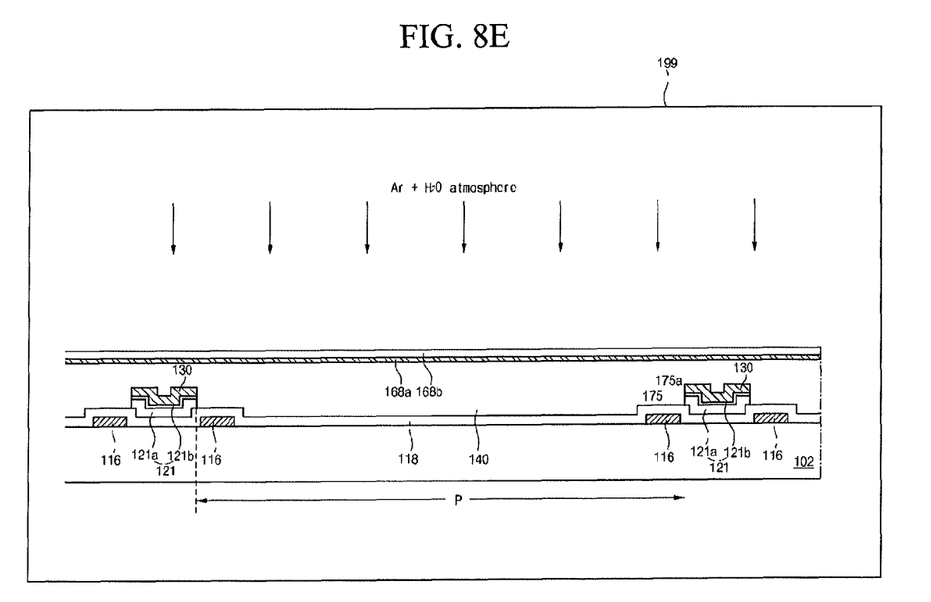

Next, referring to FIGS. 7E and 8E, the substrate 102 having the reflective conductive material layer 168a is placed in the chamber 199 where a target of a transparent conductive material is loaded. The chamber 199 is under an atmosphere containing $H_2O$ gas at a predetermined flow rate and Ar. Then, a sputtering is performed using a plasma to form a transparent conductive material layer 168b on the reflective conductive material layer 168a. The transparent conductive material layer 168b may be made of indium-tin-oxide (ITO), indium-zinc-oxide (IZO) or aluminum-doped zinc oxide (AZO). The transparent conductive material layer 168b may have a second thickness of about 200 Å to 600 Å. As mentioned above, the second thickness of the transparent conductive material layer 168b is greater than the first thickness of the reflective conductive material layer 168a.

In this process, the atmosphere of the chamber containing Ar and $H_2O$ gas as well is for adjusting an etch bias of the transparent conductive material layer 168b in the later process.

It is preferred, but not required, that the flow rate of $H_2O$ gas into the chamber 199 is 0.5 sccm to 100 sccm. In this instant, as explained below in a wet-etching process, as the flow rate increases, the etch bias increases.

Figure 7F:
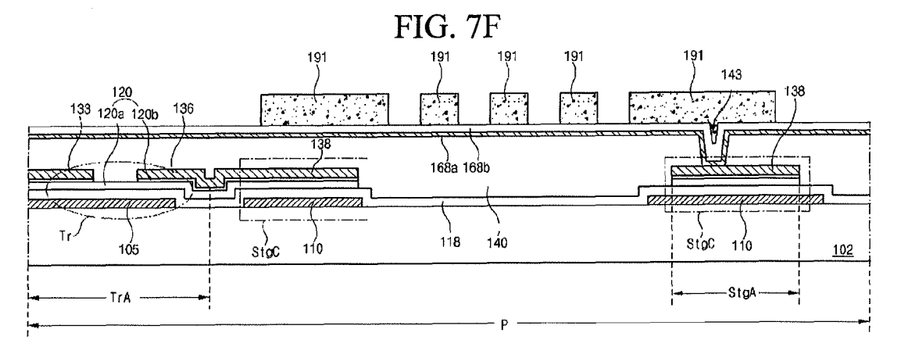
Figure 7I:
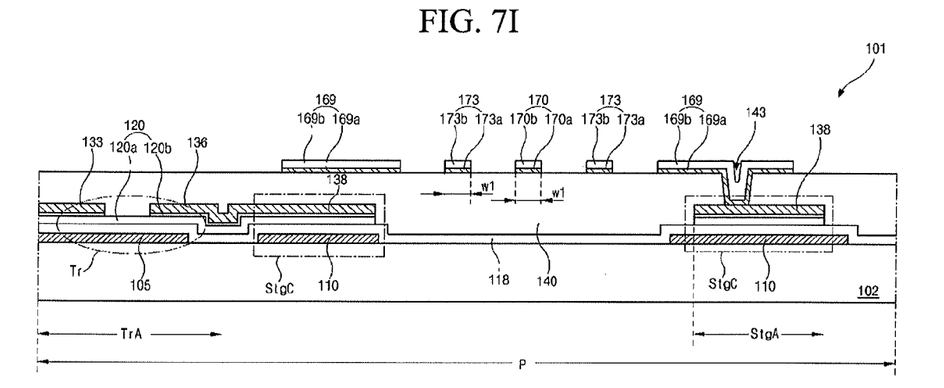
Figure 8F:
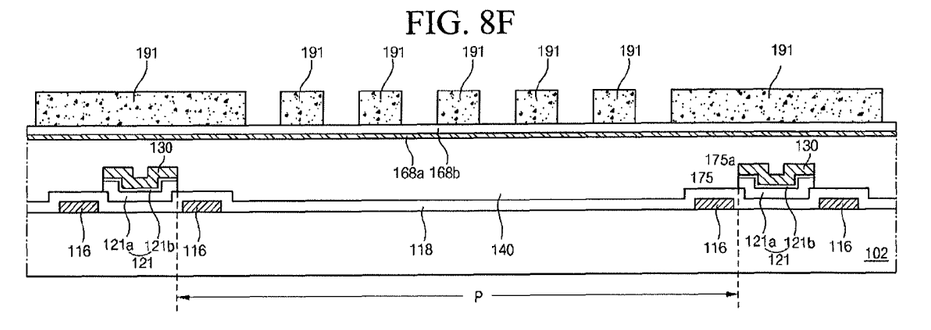

Next, referring to FIGS. 7F and 8F, a photoresist layer is formed on the transparent conductive material layer 168b. The photoresist layer is light-exposed and developed to form photoresist patterns 191. The photoresist pattern 191 to form middle common electrodes (173 of FIG. 7I) and pixel electrodes (170 of FIG. 7I) has a bar shape or bent-bar shape and has a width of about 3.1 μm which is a minimum size permissible in the light of resolution of a light exposure apparatus.

Figure 7G:
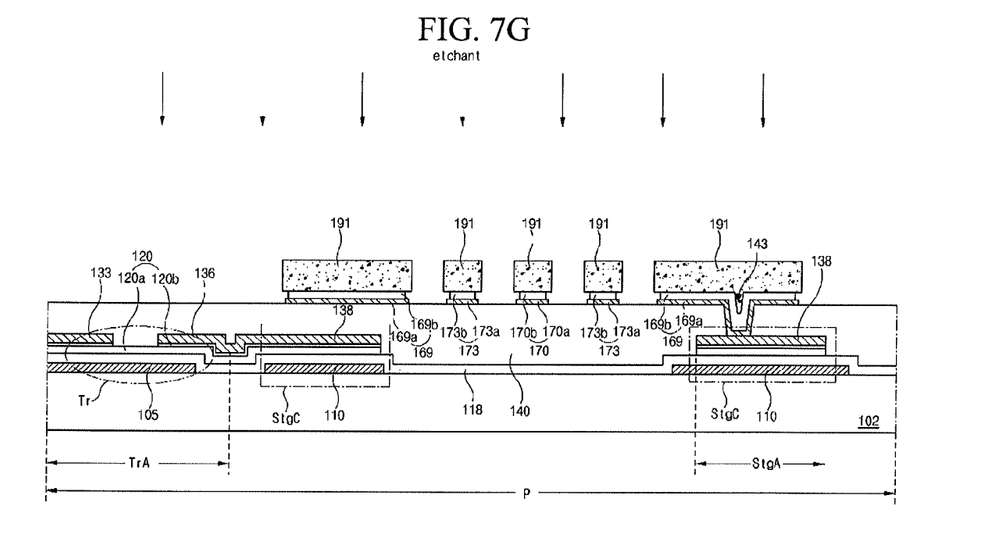
Figure 8G:
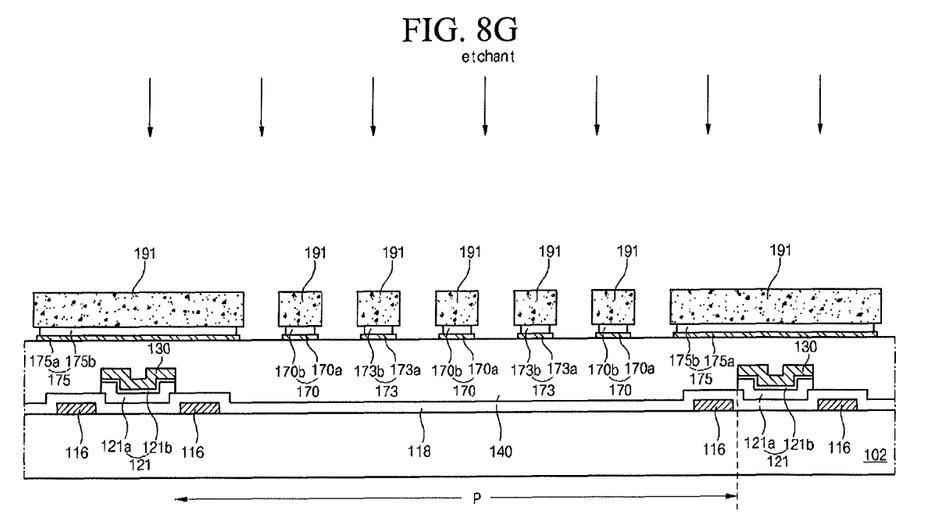

Then, referring to FIGS. 7G and 8G, the reflective conductive material layer 168a and the transparent conductive material layer 168b are simultaneously etched using an etchant that is capable of etching both of the reflective conductive material layer 168a and the conductive material layer 168b.

When the transparent conductive material layer 168b and the reflective conductive material layer 168a are exposed to the etchant, referring to FIGS. 7G and 8G, because of galvanic phenomenon, the transparent conductive material layer 168b is inward etched below the photoresist pattern 191 at a relative faster rate while the reflective conductive material layer 168a is etched at a relative slower rate.

In this instance, an etch bias of the transparent conductive material layer 168b is increased due to the $H_2O$ gas. As mentioned above, the transparent conductive material layer 168b is deposited under a condition of $H_2O$ gas, and an etching reaction of the transparent conductive material layer 168b is activated. As a result, an etch bias is increased. The etch bias is proportional to a flow rate of $H_2O$ gas. In other words, a width of the transparent conductive material layer 168b after patterning is inversely proportional to a flow rate of $H_2O$ gas.

In addition, with the same etch bias, an etching process time is decreased due to $H_2O$ gas. For the maximum etch bias, the etching process may be performed for about 80 seconds to about 100 seconds. Furthermore, with the same etching process time, an etch bias is increased due to $H_2O$ gas.

Figure 9:
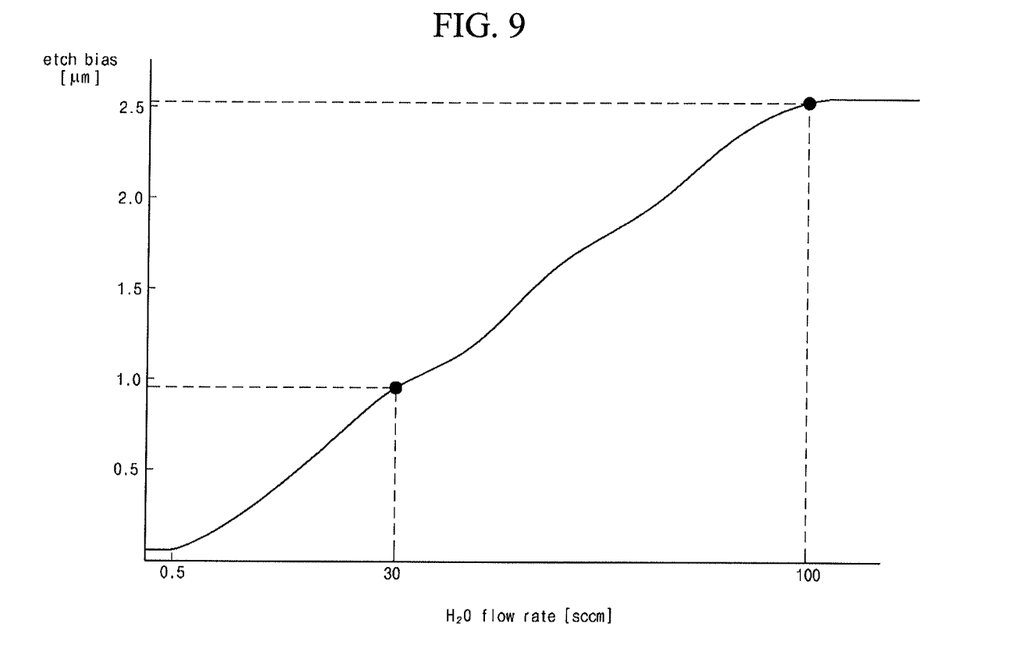
FIG. 9 is a graph showing a relation between a $H_2O$ gas flow rate and an etch bias.

FIG. 9 is a graph showing a relation between a $H_2O$ gas flow rate and an etch bias. The etch bias is measured with the constant process time and various flow rates. As shown in FIG. 9, an etch bias of the transparent conductive material layer 168b (of FIG. 7F) is proportional to a flow rate of $H_2O$ gas. However, there are upper and lower saturations. Namely, when the flow rate is below about 0.5 sccm or above about 100 sccm, the etch bias is slowly increased. With the flow rate from about 0.5 sccm to about 100 sccm, the etch bias is rapidly increased and saturated.

In the same etching time, in an instance of $H_2O$ gas at about 0.5 sccm, the etch bias is about 0.06 μm, and in an instance of $H_2O$ at about 1.0 sccm, the etch bias is about 0.15 μm. Further, in an instance of $H_2O$ at about 2.0 sccm, the etch bias is about 0.17 μm, and in an instance of $H_2O$ at about 5.0 sccm, the etch bias is about 0.21 μm. By increasing the flow rate of $H_2O$ gas, the etching process time can be decreased.

Further, in an instance of $H_2O$ at about 30 sccm to about 100 sccm, the etch bias is about 0.9 μm to about 2.6 μm. Accordingly, with the above flow rate, the pixel electrode 170 and the middle common electrode 173 having a desired width can be obtained.

For example, an etchant including hydrogen peroxide ($H_2O_2$), ammonium fluoride ($NH_4F$) and benzotriazole (BTA) or an etchant including hydrogen peroxide ($H_2O_2$), ammonium fluoride ($NH_4F$) and aminotetrazole (ATZ) may be used. But the invention is not limited thereto. Other etchants, which use to perform galvanic etching and are apparent to the skilled in the art, can be used.

Figure 7H:
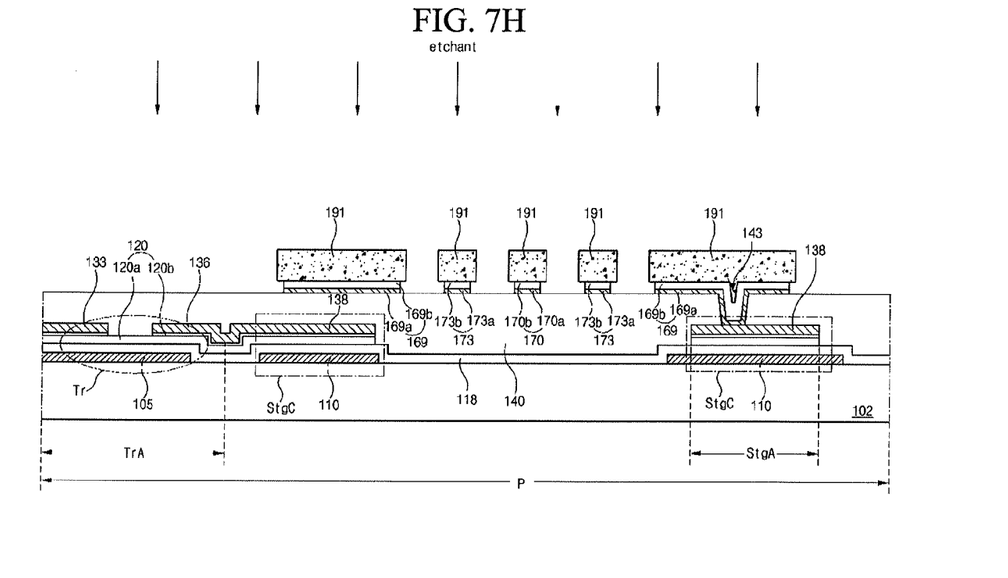
Figure 8H:
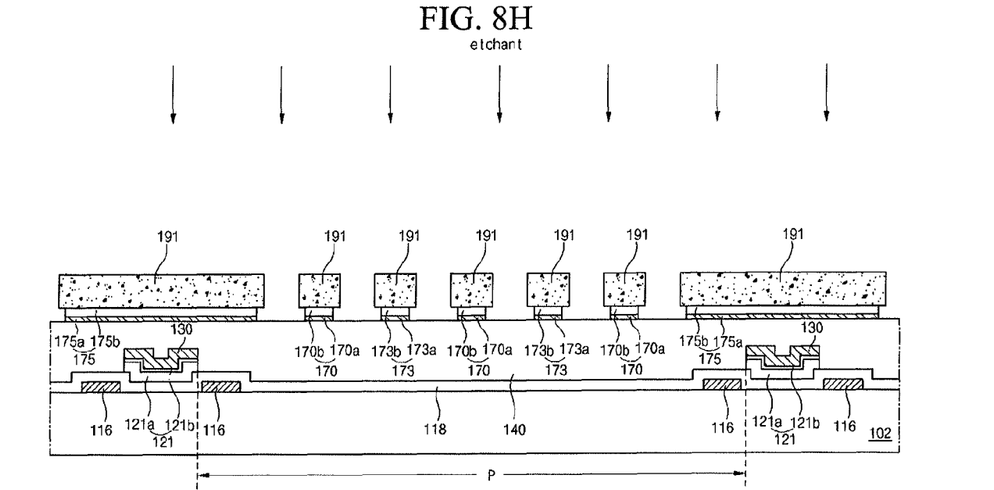

Accordingly, in this instance, referring to FIGS. 7H and 8H, side surfaces and top peripheral surfaces of lower layers 170a and 173a of the pixel electrode 170 and the middle common electrode 173 are exposed, and by this action, side etching progresses below the photoresist pattern 191 having a width of about 3.1 μm are performed. Accordingly, the pixel electrodes 170 and the middle common electrodes 173 each having a double-layered structure and having a width w1 of about 0.5 μm to less than about 2.2 μm, less than that of the photoresist pattern 191 thereon can be formed.

In other words, because of the $H_2O$ gas during deposition of the transparent conductive material layer 168b and the galvanic phenomenon, the reflective conductive material layer 168a and the transparent conductive material layer 168b can be actively etched. Accordingly, the width w1 of each of the pixel electrode 170 and the middle common electrode 173 is reduced by about 0.45 μm to 1.3 μm from each of both sides of the photoresist pattern 191 so that the width w1 becomes about 0.5 μm to less than about 2.2 μm.

Through etching process, the second auxiliary pattern 169, the first auxiliary pattern (172 of FIG. 4), and the shield pattern 175 are formed as well.

Figure 8I:
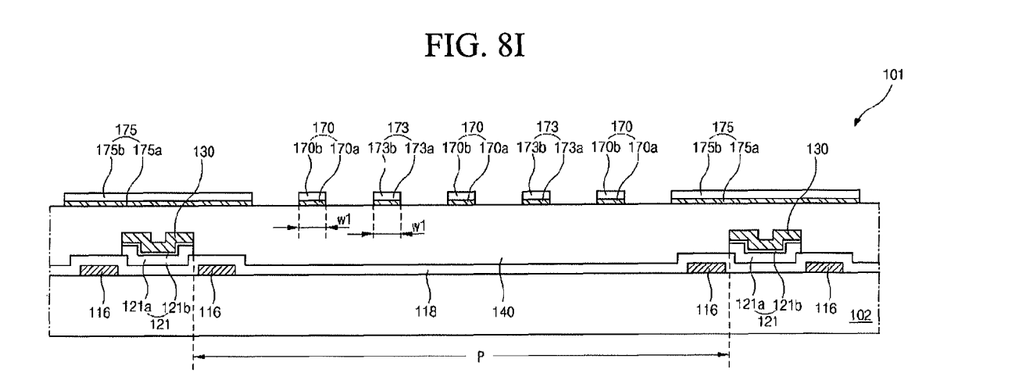

Then, referring to FIGS. 7I and 8I, the photoresist patterns 191 are removed through a stripping process.

Through the above-described processes, the array substrate 101 for the LCD device can be manufactured.

The array substrate and an opposing substrate, for example, a color filter substrate are attached with a liquid crystal layer therebetween so that the LCD device can be manufactured.

As described above, with the $H_2O$ gas, an etch bias of the transparent conductive material layer is increased. In addition, two different material layers used for the pixel and common electrodes are patterned using the etchant with etch difference between the layers. Accordingly, the pixel and common electrodes can be formed to have a width of about 2.2 μm or less. Therefore, aperture ratio can be improved.

Further, the double-layered pixel and common electrodes are configured to have a lower layer of opaque material and an upper layer of transparent conductive material. Accordingly, ambient light reflectance is reduced to 39% or less. Therefore, rainbow spot can be reduced, and ambient contrast ratio can be improved.

Further, the data line and the pixel and common electrodes are configured to have a bent shape. This makes dual domains in the pixel region. Accordingly, color difference according to variation of viewing angles can be reduced.

It will be apparent to those skilled in the art that various modifications and variations can be made in the invention without departing from the spirit or scope of the invention. Thus, it is intended that the invention cover the modifications and variations of this invention provided they come within the scope of the appended claims and their equivalents.

The invention claimed is:

1. A method of manufacturing an array substrate for a liquid crystal display device, comprising:
   depositing a reflective conductive material layer having a first thickness on a substrate;
   depositing a transparent conductive material layer having a second thickness on the reflective conductive material layer under a condition of $H_2O$ gas;
   forming a photoresist pattern on the transparent conductive material layer;
   performing a first etching process to the transparent conductive material layer and the reflective conductive material layer using the photoresist pattern as an etching mask, wherein the transparent conductive material layer has a first etch bias being larger than a second etch bias of the reflective conductive material layer such that top peripheral surfaces of the reflective conductive material layer is exposed; and
   performing a second etching process to the reflective conductive material layer using the etched transparent conductive material layer as an etching mask, thereby forming double-layered pixel and common electrodes.

2. The method according to claim 1, wherein the step of forming the transparent conductive material layer includes:

placing the substrate having the reflective conductive material layer in a chamber of a sputtering apparatus;
making the chamber under Ar atmosphere; and
performing a sputtering to form the transparent conductive material layer with flowing $H_2O$ gas into the chamber at a flow rate of about 0.5 sccm to about 100 sccm.

3. The method according to claim 2, wherein the flow rate of the $H_2O$ gas is about 30 sccm to about 100 sccm.

4. The method according to claim 1, wherein a width of each of the common and pixel electrodes is inversely proportional to a flow rate of the $H_2O$ gas.

5. The method according to claim 1, wherein the photoresist pattern corresponding to the pixel and common electrodes has a width of about 3.1 μm, thereby forming the double-layered pixel and common electrodes having a width of about 0.5 μm to less than about 2.2 μm.

6. The method according to claim 5, wherein the step of etching is performed using an etchant which utilizes a galvanic phenomenon and is capable of etching both layers of the double-layered pixel and common electrodes.

7. The method according to claim 6, wherein the etchant includes hydrogen peroxide ($H_2O_2$), ammonium fluoride ($NH_4F$) and benzotriazole (BTA), or the etchant includes hydrogen peroxide ($H_2O_2$), ammonium fluoride ($NH_4F$) and aminotetrazole (ATZ).

8. The method according to claim 6, wherein a total time of the first and second etching processes is about 80 seconds to about 100 seconds.

9. The method according to claim 1, wherein the reflective conductive material layer comprises a material selected from the group consisting of molybdenum (Mo), molybdenum-titanium (MoTi), copper (Cu) or copper nitride (CuNx), and the transparent conductive material layer is made of indium-tin-oxide (ITO), indium-zinc-oxide (IZO) or aluminum-doped zinc-oxide (AZO).

10. The method according to claim 1, wherein the first thickness is 50 Å to 500 Å, and the second thickness is about 200 Å to about 600 Å, and wherein the second thickness is greater than the first thickness.

11. The method according to claim 1, further comprising:
forming gate and data lines to define a pixel region, a common line spaced apart from and parallel with the gate line, and a thin film transistor in the pixel region and connected to the gate and data lines; and
forming a passivation layer on the thin film transistor,
wherein forming the gate and data lines, the common line, the thin film transistor and the passivation layer is prior to forming the reflective conductive material layer.

12. The method according to claim 1, wherein the condition of $H_2O$ gas excludes an oxygen gas.

13. A method of manufacturing an array substrate for a liquid crystal display device, comprising:
depositing a reflective conductive material layer having a first thickness on a substrate;
depositing a transparent conductive material layer having a second thickness, on the reflective conductive material layer;
forming a photoresist pattern on the transparent conductive material layer;
performing a first etching process to the transparent conductive material layer and the reflective conductive material layer using the photoresist pattern as an etching mask, wherein the transparent conductive material layer has a first etch bias being larger than a second etch bias of the reflective conductive material layer such that top peripheral surfaces of the reflective conductive material layer is exposed; and
performing a second etching process to the reflective conductive material layer using the etched transparent conductive material layer as an etching mask, thereby forming a double-layered electrode.

14. The method according to claim 13, wherein the step of depositing the transparent conductive material layer is conducted under a condition of $H_2O$ gas, and a flow rate of the $H_2O$ gas is about 0.5 sccm to about 100 sccm.

* * * * *